(12) United States Patent
Amekawa

(10) Patent No.: US 7,231,622 B2
(45) Date of Patent: Jun. 12, 2007

(54) METHOD FOR CORRECTING CROSSTALK

(75) Inventor: Naoki Amekawa, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 12 days.

(21) Appl. No.: 11/226,326

(22) Filed: Sep. 15, 2005

(65) Prior Publication Data

US 2006/0015834 A1 Jan. 19, 2006

Related U.S. Application Data

(62) Division of application No. 10/690,651, filed on Oct. 23, 2003, now Pat. No. 6,983,436.

(30) Foreign Application Priority Data

Nov. 20, 2002 (JP) .............................. 2002-336473

(51) Int. Cl.
*G06F 17/50* (2006.01)
(52) U.S. Cl. ................... 716/6; 716/9; 716/11; 716/12; 716/18
(58) Field of Classification Search .................... 716/2, 716/6, 7, 11, 12, 18
See application file for complete search history.

(56) References Cited

U.S. PATENT DOCUMENTS

| 6,160,423 A * | 12/2000 | Haq .............................. 327/41 |
| 2002/0046389 A1 | 4/2002 | Hirakimoto et al. |
| 2002/0104066 A1 | 8/2002 | Irie |

FOREIGN PATENT DOCUMENTS

JP P3175653 4/2001

OTHER PUBLICATIONS

Synopsys, Inc., "AstroPrimer Introduction to Astro Timing Optimized Layout Release" 2001.2, users manual, U.S., SynopsysCorporation, Feb. 2001, pp. 13 to 20.

* cited by examiner

*Primary Examiner*—Thuan Do
(74) *Attorney, Agent, or Firm*—McDermott Will & Emery LLP

(57) ABSTRACT

In a semiconductor integrated circuit, there is provided a method for correcting crosstalk, which exerts an influence via coupling capacitance between wiring by the signal transitions between adjacent wiring, comprising the step of creating a candidate for buffer division, the step of creating a candidate for cell movement, or the step of victim net logic synthesis. Thereby, the crosstalk is corrected through the buffer division, the cell movement, or an increase of elements in number by logic decomposition, logic inversion and a change of fan-outs in number.

2 Claims, 14 Drawing Sheets

METHOD FOR CORRECTING CROSSTALK

This application is a divisional of Application 10/690,651, filed Oct. 23, 2003, now U.S. Pat. No. 6,983,436, which claims priority of Japanese Patent Application No. 2002-336473, filed Nov. 20, 2002, the contents of which are hereby incorporated by reference.

BACKGROUND OF THE INVENTION

The present invention relates to a method for correcting crosstalk as one of layout corrections to render crosstalk between wires harmless in layout designing of a semiconductor integrated circuit.

In recent years, with the miniaturization in semiconductor manufacturing technology, crosstalk cannot be ignored. Crosstalk exerts an influence via coupling capacitance between adjacent wires by the transition of signals thereof in a semiconductor integrated circuit. This phenomenon causes delay variation, timing limitation infringement, or the function error that logic is inverted.

Accordingly, in the layout design of a semiconductor integrated circuit, there has been needed crosstalk correction for correcting the layout in order not to cause the timing limitation infringement or logic inversion due to crosstalk as well as the detection of the occurrence of crosstalk.

In a conventional method for correcting crosstalk, a repeater buffer is inserted into a net affected by the occurrence of crosstalk, and the wiring thereof is divided to reduce the coupling capacitance between the wires, thereby suppressing crosstalk (referred to as buffer insertion, for example, refer to patent literature 1).

In addition, there is provided shield wiring fixed to a constant voltage at one or both sides of wiring affected by the occurrence of crosstalk to reduce the coupling capacitance with affecting wiring (referred to as shielding).

Furthermore, in some cases, the following methods have been used: the current driving capability of a cell which drives a net affected by crosstalk is increased to hardly exert a crosstalk influence by the transition of signals in adjacent wires (referred to as cell sizing) or wiring is detoured to avoid an occurrence position of crosstalk (referred to as wiring detour, refer to non-patent literature 1).
(Patent Literature 1)
Japanese Patent Laid-Open Publication No. 3175653
(Non-Patent Literature 1)
Synopsys, Inc., "AstroPrimer Introduction to Astro Timing Optimized Layout Release 2001.2), users manual, U.S., SynopsysCorporation, February 2001, pages 13 to 20

However, the above-mentioned conventional methods for preventing crosstalk have problems that layout resources are consumed for the insertion of buffers or shield wiring, or the upgrade of the cell, that the area is increased, or that an increase in the capacitance and the use of a cell with large current driving capability lead to increased power consumption. Furthermore, as for the wiring detour, new coupling capacitance with another wiring is generated in the detour to thereby cause new crosstalk, which deteriorates the convergence of timing design.

SUMMARY OF THE INVENTION

Accordingly, the main object of the present invention is to provide a method for correcting crosstalk, in which the timing limitation infringement and function error due to crosstalk can be corrected without increasing the area and power consumption.

In order to solve the above-mentioned problems, according to the present invention, the following means are taken in the layout design of a semiconductor integrated circuit constituted by connecting basic logic cells or functional macro blocks by wires between cells.

As first means for solving the problems, a method for correcting crosstalk according to the present invention comprises:

the step of a first checking of a parallel wiring length, wherein data of a parallel wiring length allowable value and layout data regarding crosstalk are input to extract information of parallel wiring length infringement based on both the input data;

the step of searching for an empty space, wherein cell area information is input and the empty space is searched for on an infringing wiring route included in the information of parallel wiring length infringement while referring to the cell area information to extract empty space information;

the step of creating a candidate for buffer division, wherein a plurality of inverters to be divided from a driving buffer of the infringing wiring part or a driving buffer at the next stage are extracted as a candidate for crosstalk correction;

the step of arranging and wiring, wherein the inverters as the candidate for crosstalk correction are arranged and wired in the empty space included in the empty space information; and the step of a second checking of the parallel wiring length, wherein parallel wiring length infringement is checked with respect to the inverters newly arranged.

The data of the parallel wiring length allowable value corresponds to delay variation and logic inversion due to crosstalk varying in accordance with a wiring layer, a width between wires, and driving capability of the driving cell of the net, the information of parallel wiring length infringement is a list of infringing wiring which generates problems due to crosstalk, and the step of searching for the empty space is intended to search for whether a new element can be arranged on the infringing wiring route (hereinafter, the above-mentioned data, information and step indicate the same).

In the above-mentioned step of creating a candidate for buffer division, the candidate for crosstalk correction is extracted, in which in the empty space included in the empty space information, the driving buffer of the infringing wiring part or the driving buffer at the next stage is divided into the plurality of inverters to be arranged, thereby making the parallel wiring part shorter and correcting the crosstalk infringement.

According to the first means for solving the problem, the driving buffer of the parallel wiring exceeding the parallel wiring length allowable value or the driving buffer at the next stage is divided into the plurality of inverter combinations to be arranged on the parallel wiring route. Thereby, the delay variation and logic inversion exceeding allowable values thereof due to crosstalk can be prevented from occurring. As a result, the timing limitation infringement and function error due to crosstalk can be corrected without increasing the area and power consumption.

As second means for solving the problem, a method for correcting crosstalk according to the present invention comprises:

the step of the first checking of a parallel wiring length, wherein data of a parallel wiring length allowable value and layout data regarding crosstalk are input to extract information of parallel wiring length infringement based on both the input data;

the step of searching for an empty space, wherein cell area information is input and the empty space is searched for on an infringing wiring route included in the information of parallel wiring length infringement while referring to the cell area information to extract empty space information;

the step of creating a candidate for cell movement, wherein a cell to be moved out of a driving cell of the infringing wiring part and a driving cell at the next stage is extracted as a candidate for crosstalk correction;

the step of arranging and wiring, wherein, the cell as the candidate for crosstalk correction is arranged and wired in the empty space included in the empty space information; and the step of a second checking of the parallel wiring length, wherein parallel wiring length infringement is checked with respect to the cell newly arranged.

In the above-mentioned step of creating a candidate for cell movement, the candidate for crosstalk correction is extracted, in which in the empty space included in the empty information, the driving cell of the infringing wiring part or the driving cell at the next stage is moved to be arranged and the parallel wiring part thereof is shortened to correct the crosstalk infringement. In this case, it is preferable that a ratio of a cell movement distance with respect to a pre-stage wiring length and a post-stage wiring length from the moved cell be not more than a predetermined value.

According to the second means for solving the problem, by moving the driving cell of the parallel wiring exceeding the parallel wiring length allowable value or the driving cell at the next stage on the parallel wiring route, the delay variation and logic inversion exceeding allowable values thereof due to crosstalk can be prevented from occurring. As a result, the timing limitation infringement and function error due to crosstalk can be corrected without increasing the area and power consumption.

As third means for solving the problem, a method for correcting crosstalk according to the present invention comprises:

the step of a first checking of a parallel wiring length, wherein data of a parallel wiring length allowable value and layout data regarding crosstalk are input to extract information of parallel wiring length infringement based on both the input data;

the step of searching for an empty space, wherein cell area information is input and the empty space is searched for on an infringing wiring route included in the information of parallel wiring length infringement while referring to the cell area information to extract empty space information;

the step of victim net logic synthesis, wherein logic connection information is input and a candidate for crosstalk correction is extracted, in which logic of a net part including the parallel wiring length infringing wiring is resynthesized based on the logic connection information to increase the number of elements to be arranged or to change fan-outs for correcting the crosstalk infringement;

the step of arranging and wiring, wherein based on the candidate for crosstalk correction, a cell is arranged and wired in the empty space included in the empty space information; and the step of a second checking of the parallel wiring length, wherein parallel wiring length infringement is checked with respect to the new corrected circuit.

In the above-mentioned step of victim net logic synthesis, by increasing the number of elements to be arranged or decreasing a slew rate (signal transition time) entailed by the change in the fan-outs, the crosstalk infringement is corrected.

According to the third means for solving the problem, by logically decomposing the driving cell of the parallel wiring length exceeding the allowable value thereof or the driving cell at the next stage, or changing the number of the fan-outs to increase the number of elements by logic resynthesis, the delay variation and logic inversion exceeding allowable values thereof due to crosstalk can be prevented from occurring. As a result, the timing limitation infringement and function error due to crosstalk can be corrected without increasing the area and power consumption.

As fourth means for solving the problem, a method for correcting crosstalk according to the present invention comprises:

the step of crosstalk analysis, wherein logic connection information, RC information, analytical limitation information, delay library, and crosstalk analysis library are input to perform delay calculation and timing analysis in view of delay variation due to crosstalk caused by synchronous transitions from a timing window based on the input information and the like, and crosstalk infringement information which includes wiring with crosstalk generated and timing window data are extracted;

the step of searching for an empty space, wherein cell area information is input and the empty space is searched for on a wiring route adjacent to the position with crosstalk generated which is included in the crosstalk infringement information while referring to the cell area information to extract empty space information;

the step of logic synthesis of both aggressor and victim nets, wherein a candidate for crosstalk correction is extracted, in which the empty space information and the timing window data are referred to, logic of an affecting side and an affected side of the wiring nets with crosstalk generated is decomposed, synchronous in-phase transition is inverted to opposite-phase transition or opposite-phase transition to in-phase transition, and the delay variation is changed so as to keep the safe side with respect to the timing limitation;

the step of arranging and wiring, wherein a cell is arranged and wired based on the candidate for crosstalk correction; and the step of a second crosstalk analysis, wherein crosstalk infringement is checked with respect to the new corrected circuit.

The RC information is information of a parasitic element. Furthermore, the analytical limitation information includes clock setting, operation mode setting for timing analysis, and the like. The timing window indicates the timing of signal transition with respect to cycle time. The wiring with crosstalk generated means path wiring with timing infringement due to crosstalk (hereinafter, the above-mentioned information, timing window, and wiring indicate the same).

In the above-mentioned step of logic synthesis of both aggressor and victim nets, the delay variation which accelerates (or deaccelerates) due to the generated crosstalk is changed so as to keep the safe side with respect to the timing limitation, thereby rendering the crosstalk influence harmless.

According to the fourth means for solving the problem, for the path infringing the timing limitation due to crosstalk, a signal transition direction is inverted by logic resynthesis not to generate the delay variation due to crosstalk or if ever, the delay can be varied to a harmless direction. As a result, the timing limitation infringement and function error due to crosstalk can be corrected without increasing the area and power consumption.

As fifth means for solving the problem, a method for correcting crosstalk according to the present invention comprises:

the step of crosstalk analysis, wherein logic connection information, RC information, analytical limitation information, delay library, and crosstalk analysis library are input to perform delay calculation and timing analysis in view of delay variation due to crosstalk caused by synchronous transitions from a timing window based on the input information and the like, and slack data which includes timing limitation infringement information and timing window data are extracted;

the step of extracting a net to be corrected, wherein the net to be corrected which has coupling capacitance exceeding a predetermined value with adjacent wiring is extracted from nets on timing limitation infringing paths which are included in the slack data, the step of searching for an empty space, wherein cell area information is input and referring to the cell area information, the empty space is searched for on a wiring route having the coupling capacitance which is included in the information of the net to be corrected to extract empty space information;

the step of logic synthesis of the timing limitation infringing path, wherein a candidate for crosstalk correction is extracted, in which the empty space information and the timing window data are referred to, the logic synthesis in which logic of the nets including the adjacent wiring parts is decomposed or the number of fan-outs thereof is changed is performed to find signal transitions between the adjacent wiring to be synchronous, and in the case of hold infringement, to inverse the transition to be in-phase while in the case of setup infringement, to be opposite-phase;

the step of arranging and wiring, wherein a cell is arranged and wired based on the candidate for crosstalk correction; and the step of the second crosstalk analysis, wherein crosstalk infringement is checked with respect to the new corrected circuit.

The above-mentioned slack data includes the timing limitation infringement information.

According to the fifth means for solving the problem, for the path infringing the timing limitation, a signal transition direction is inverted by logic resynthesis or a load is varied by the change in the fan-outs. This allows crosstalk delay variation, in which the delay is varied in the opposite direction to the timing infringement, to be generated, thereby eliminating the timing infringement by delay variation due to crosstalk. As a result, the timing limitation infringement and function error due to crosstalk can be corrected without increasing the area and power consumption.

The foregoing and other aspects will become apparent from the following description of the invention when considered in conjunction with the accompanying drawing figures.

BRIEF DESCRIPTION OF THE DRAWINGS

In all these figures, like components are indicated by the same numerals.

DETAILED DESCRIPTION

Figure 1:
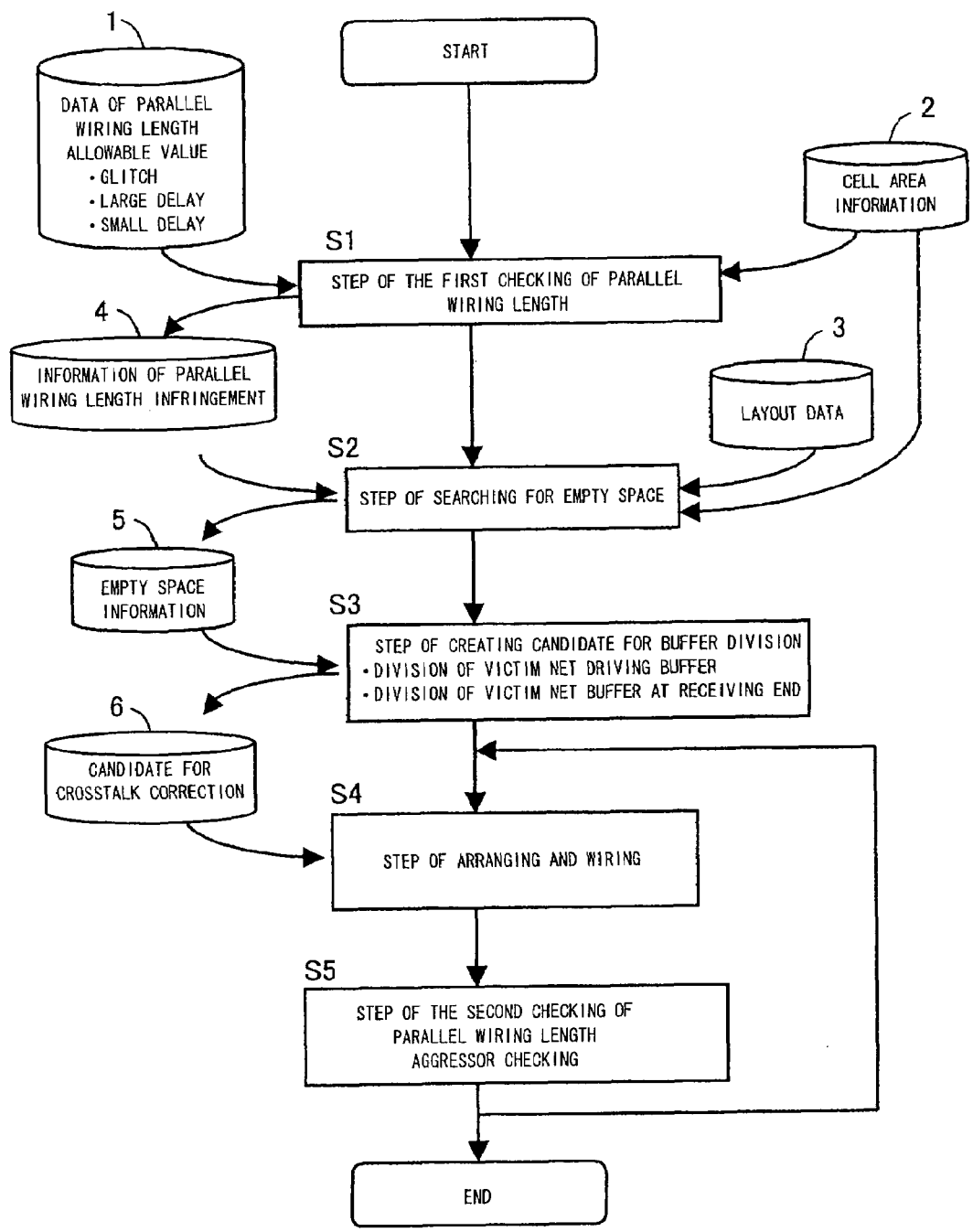
FIG. 1 is a flow diagram showing a method for correcting crosstalk (buffer division) according to a first embodiment of the present invention.

Referring to the drawings, a description is given of preferred embodiments of the method for correcting crosstalk according to the present invention.

(Supplementary Explanation)

Prior to the explanation of the method for correcting crosstalk according to the embodiments of the present invention, basic points are explained in reference to FIGS. 11 to 14 for understanding easily.

A path consisting of a drive cell 203, wiring 205, and a driven cell 204 is assumed to be an aggressor which gives an influence of a crosstalk; in contrast, a path consisting of a drive cell 200, wiring 202, and a driven cell 201 is assumed to be a victim which suffers the influence of the crosstalk.

Figure 11A:
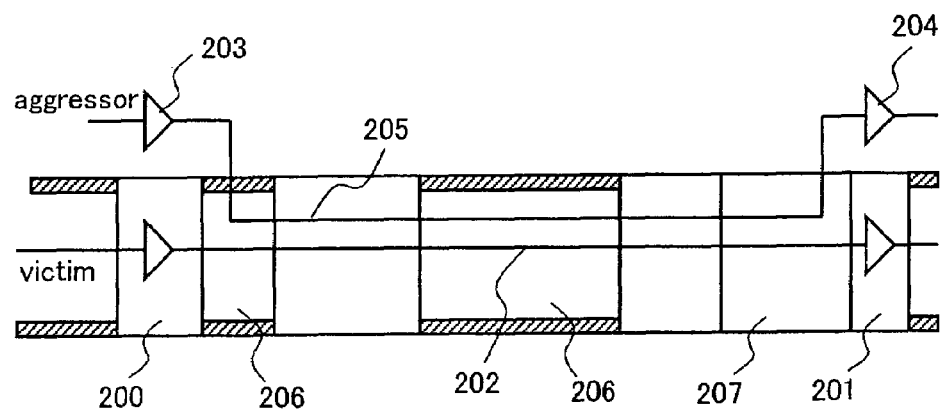
FIG. 11A is a diagram showing a specific example before performing buffer insertion according to supplementary explanation.
Figure 11B:
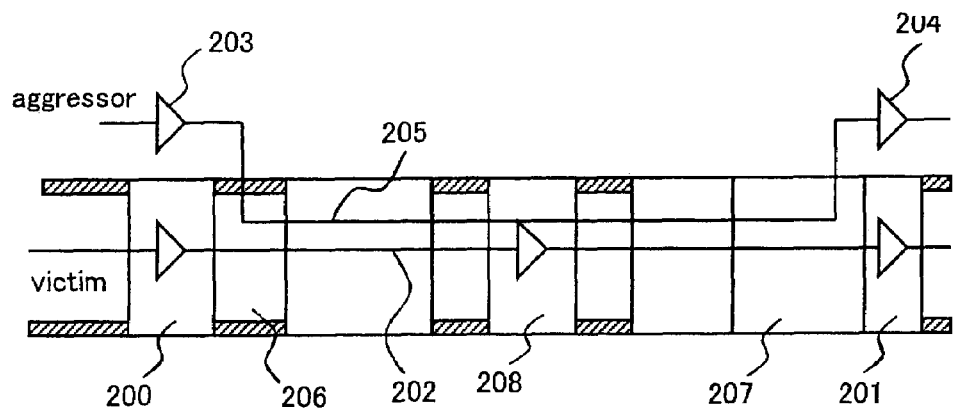
FIG. 11B is a diagram showing a specific example after performing the buffer insertion.

First, referring to FIG. 11, a basic example of the crosstalk correction by buffer insertion is described. FIG. 11A shows a layout consisting of a driving cell 200, a driven cell 201 and wiring 202 of a victim net, a driving cell 203, a driven cell 204 and wiring 205 of an aggressor net, empty space 206, and an existing cell 207. When the victim net is to be corrected, the empty space is searched for on the wiring 202 of the victim net to insert a repeater buffer 208 having sufficient driving capability to render the influence by crosstalk harmless, as shown in FIG. 11B.

In this case there arises a problem that layout resources are consumed for the buffer insertion.

Figure 12A:
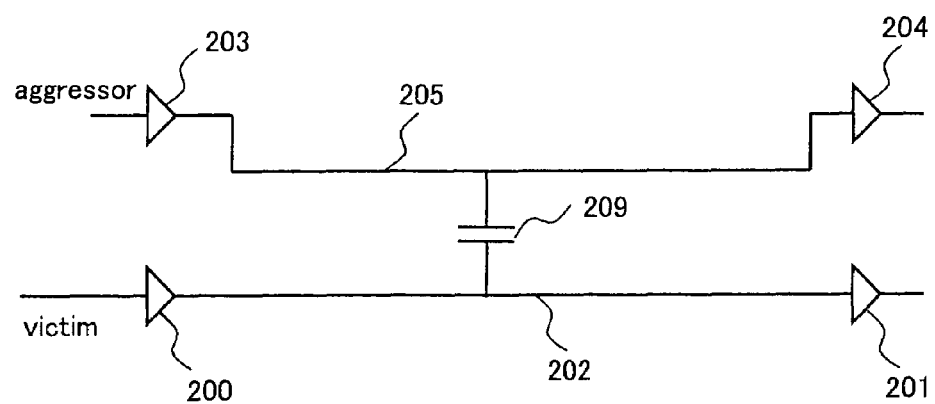
FIG. 12A is a diagram showing a specific example before performing shield insertion in shielding according to the supplementary explanation.
Figure 12B:
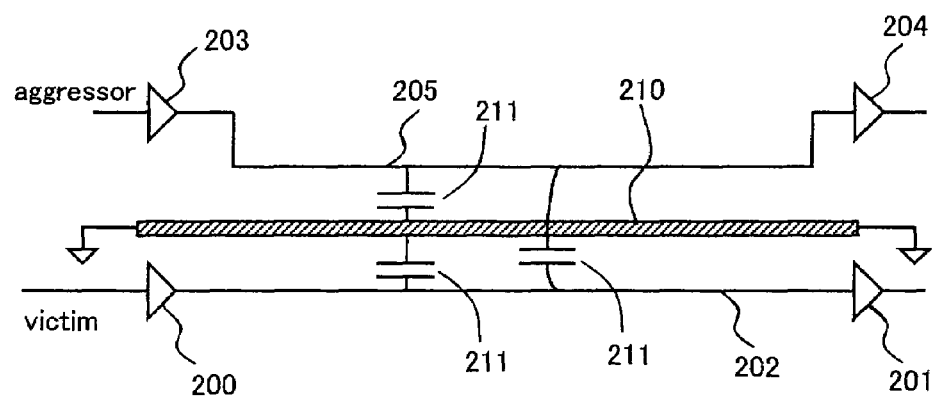
FIG. 12B is a diagram showing a specific example after performing the shield insertion.

Next, referring to FIG. 12, a basic example of the crosstalk correction by shielding is described. FIG. 12A shows a layout consisting of the driving cell 200, the driven cell 201 and the wiring 202 of the victim net, the driving cell 203, the driven cell 204 and the wiring 205 of the aggressor net, and coupling capacitance 209. When the victim net is to be corrected, a space capable of wiring is searched for between the wires to provide shield wiring 210 as shown in FIG. 12B. Coupling capacitance 211 is much lower than the original coupling capacitance 209.

In this case, there arises a problem that the area is increased due to the shield wiring insertion.

Figure 13A:
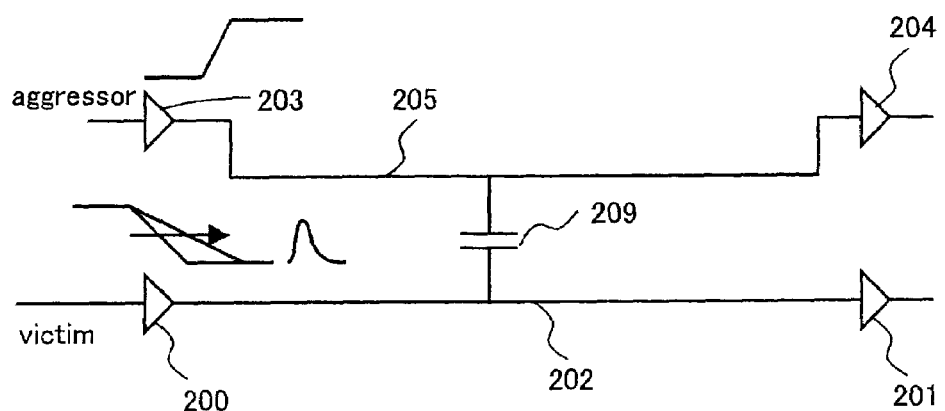
FIG. 13A is a diagram showing a specific example before performing cell size up in cell sizing according to the supplementary explanation.
Figure 13B:
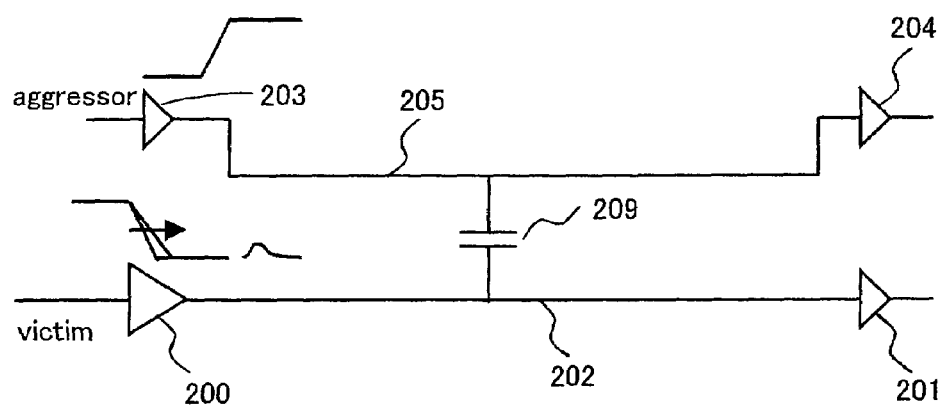
FIG. 13B is a diagram showing a specific example after performing the cell size up.

Referring to FIG. 13, a basic example of the crosstalk correction by cell sizing is described. FIG. 13A shows a layout consisting of the driving cell 200, the driven cell 201 and the wiring 202 of the victim net, the driving cell 203, the driven cell 204, and the wiring 205 of the aggressor net, and the coupling capacitance 209. When the victim net is to be corrected, the driving cell 200 of the victim net is enlarged, as shown in FIG. 13B if a sufficient space for arrangement is secured. As a result, a slew rate of the victim net becomes low, and in the case where signals of the aggressor net and the victim net transit synchronously, delay variation becomes small. Furthermore, in the case where the aggressor net transits while behaviors of the victim net remain still, transistor resistance of the driving cell 200 of the victim net becomes low, reducing a generated glitch (whisker-like pulse).

In this case, however, there arise problems that the area is increased due to cell upgrade and that power consumption is increased by the use of a cell having large current driving capability.

Figure 14A:
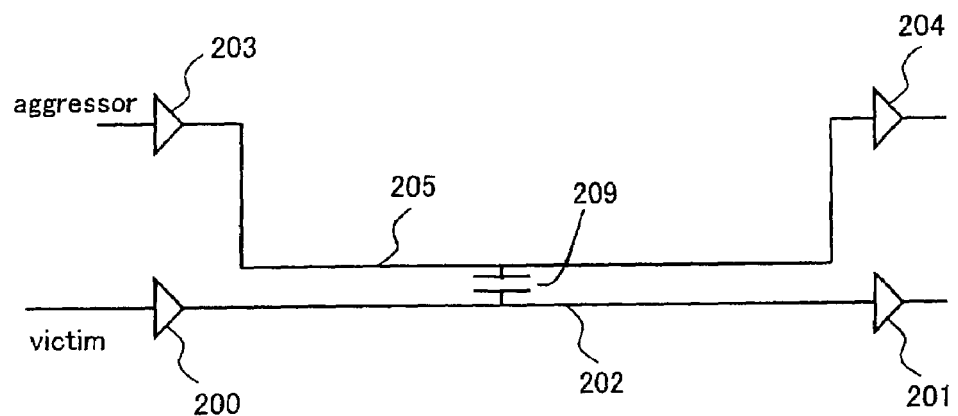
FIG. 14A is a diagram showing a specific example before performing wiring detour in wiring detour according to the supplementary explanation.
Figure 14B:
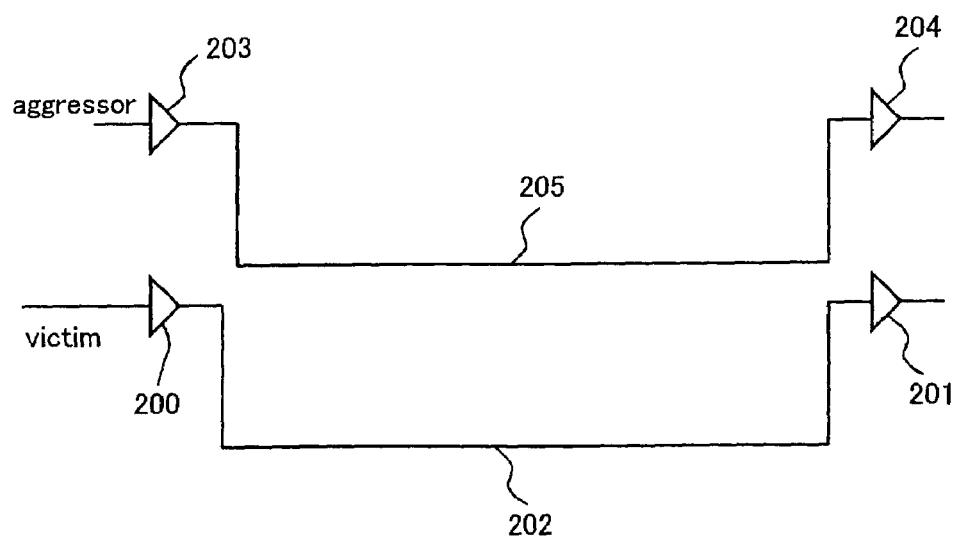
FIG. 14B is a specific example after performing the wiring detour.

Referring to FIG. 14, a basic example of the crosstalk correction by wiring detour is described. FIG. 14A shows the driving cell 200, the driven cell 201 and the wiring 202 of the victim net, the driving cell 203, the driven cell 204, and the wiring 205 of the aggressor net, and the coupling capacitance 209. When the victim net is to be corrected, a space capable of wiring is searched for to detour the wiring in such a manner as the victim net wiring 202 as shown in FIG. 14B. This allows the coupling with the aggressor wiring 205 to be ignored.

In this case, however, there also arises a problem that the wiring detour generates new coupling capacitance with another wiring in the detour to thereby cause new crosstalk, which deteriorates the convergence of timing design.

Hereinafter, a description is given of a method for correcting crosstalk according to the embodiments of the present invention.

Embodiment 1

Figure 2A:
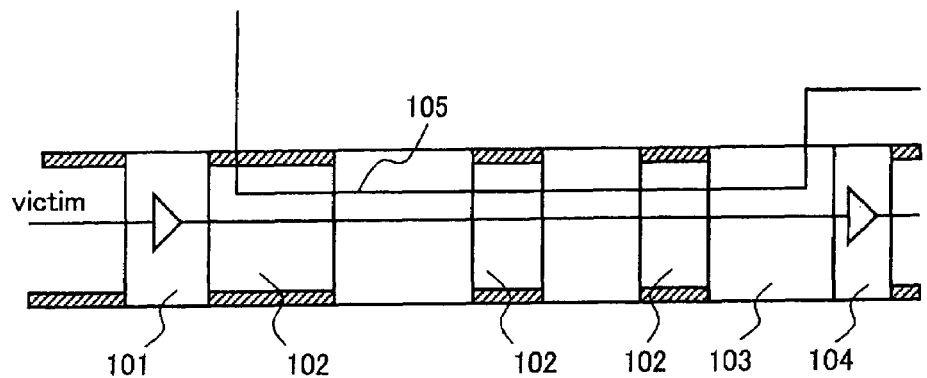
FIG. 2A is a diagram showing a specific example before performing the buffer division which is the method for correcting crosstalk according to the first embodiment of the present invention.
Figure 2B:
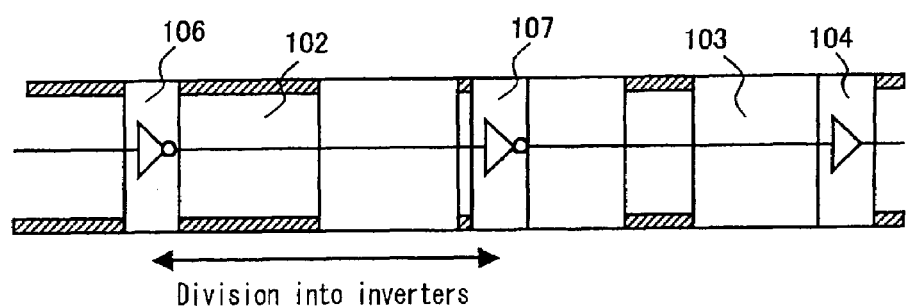
FIG. 2B is a diagram showing an example of the division of a net driving buffer.
Figure 2C:
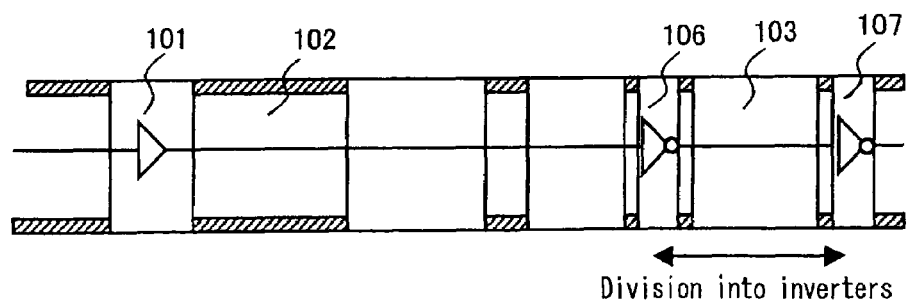
FIG. 2C is a diagram showing an example of the division of a driving buffer at the next stage.

FIG. 1 is a flow diagram showing a method for correcting crosstalk (buffer division) according to a first embodiment of the present invention, and FIGS. 2A, 2B and 2C are diagrams showing specific examples thereof.

In FIG. 1, S1 designates the step of the first checking of a parallel wiring length; S2, the step of searching for an empty space on a wiring route; S3, the step of creating a candidate for buffer division; S4, the step of arranging and wiring; and S5, the step of the second checking of the parallel wiring length. A reference numeral 1 designates data of a parallel wiring length allowable value; a reference numeral 2, layout data; a reference numeral 3, cell area information; a reference numeral 4, information of parallel wiring length infringement; a reference numeral 5, empty space information; and a reference numeral 6, a candidate for crosstalk correction.

In FIGS. 2A, 2B and 2C, a reference numeral 101 designates a driving cell of a victim net; a reference numeral 102, an empty space; a reference numeral 103, an existing cell; a reference numeral 104, a victim net driving cell at the next stage; a reference numeral 105, adjacent wiring; a reference numeral 106, a pre-stage inverter after division; and a reference numeral 107, a post-stage inverter after division.

With respect to the method for correcting crosstalk having the above-mentioned configuration according to the present embodiment, behaviors thereof are described below.

Referring to FIG. 1, in step S1 of the first checking of a parallel wiring length, the input data 1 of a parallel wiring length allowable value is referred to and the information of parallel wiring length infringement 4, which is a list of infringing wiring having a parallel part exceeding the allowable value, is extracted on the input layout data 2. The data 1 of the parallel wiring length allowable value is beforehand obtained by simulating delay variation and logic inversion due to crosstalk varying in accordance with a wiring layer, a width between wires and driving capability of the driving cell on the net by using a circuit simulator such as SPICE.

In step S2 of searching for an empty space on the route, the input layout data 2 and the input cell area information 3 are referred to, and the information 5 of the empty space capable of arrangement is extracted by searching for whether or not a new element can be arranged on an infringing wiring route included in the information of parallel wiring length infringement 4.

In step S3 of creating a candidate for buffer division, in the case where the cell driving in the infringing wiring part included in the information of parallel wiring length infringement 4 or the driving cell at the next stage is a buffer, in the empty space included in the empty space information 5, the driving buffer of the infringing wiring part or the driving buffer at the next stage is divided into two inverter combinations. Then, the candidate for crosstalk correction 6 is extracted as a change candidate to be arranged on the wiring route. Inverters added by division divide the infringing parallel wiring part and shorten the parallel wiring length, which suppresses the parallel wiring length infringement.

In step S4 of arranging and wiring, the inverter combinations obtained by dividing the buffer are arranged in accordance with the candidate for crosstalk correction 6, and the wiring is connected to an input pin of the cell.

In step S5 of the second checking of the parallel wiring length, it is checked whether or not the changed part causes new parallel wiring length infringement. When the infringement occurs, the procedure returns to step S4 of arranging and wiring to repeat it.

Specific examples of the method for correcting crosstalk behaving in the above-mentioned manner according to the present invention are explained below.

Referring to FIG. 2A, there is arranged the adjacent wiring 105 to the victim net, and the parallel wiring length with the adjacent wiring 105 is larger than the value included in the data 1 of the parallel wiring length allowable value shown in FIG. 1 with respect to the driving capability of the driving cell 101 of the victim net, which shows an example of the parallel wiring length infringement. In this case, since there is an empty space capable of arrangement, which is found by searching for the empty space 102 in which a cell can be arranged on the wiring route, the driving cell 101 or the driving cell 104 at the next stage of the victim net is divided into the inverters to be arranged.

In FIG. 2B, the driving cell 101 of the victim net is divided into the two inverters 106 and 107 to be arranged and wired.

In FIG. 2C, the driving cell 104 at the next stage of the victim net is divided into the two inverters 106 and 107 to be arranged and wired.

As described above, according to the present embodiment, the driving buffer of the parallel wiring exceeding the parallel wiring length allowable value or the driving buffer at the next stage is divided into the inverter combinations to be arranged on the parallel wiring route, whereby the delay variation and logic inversion exceeding allowable values thereof due to crosstalk are prevented from occurring.

Embodiment 2

Figure 3:
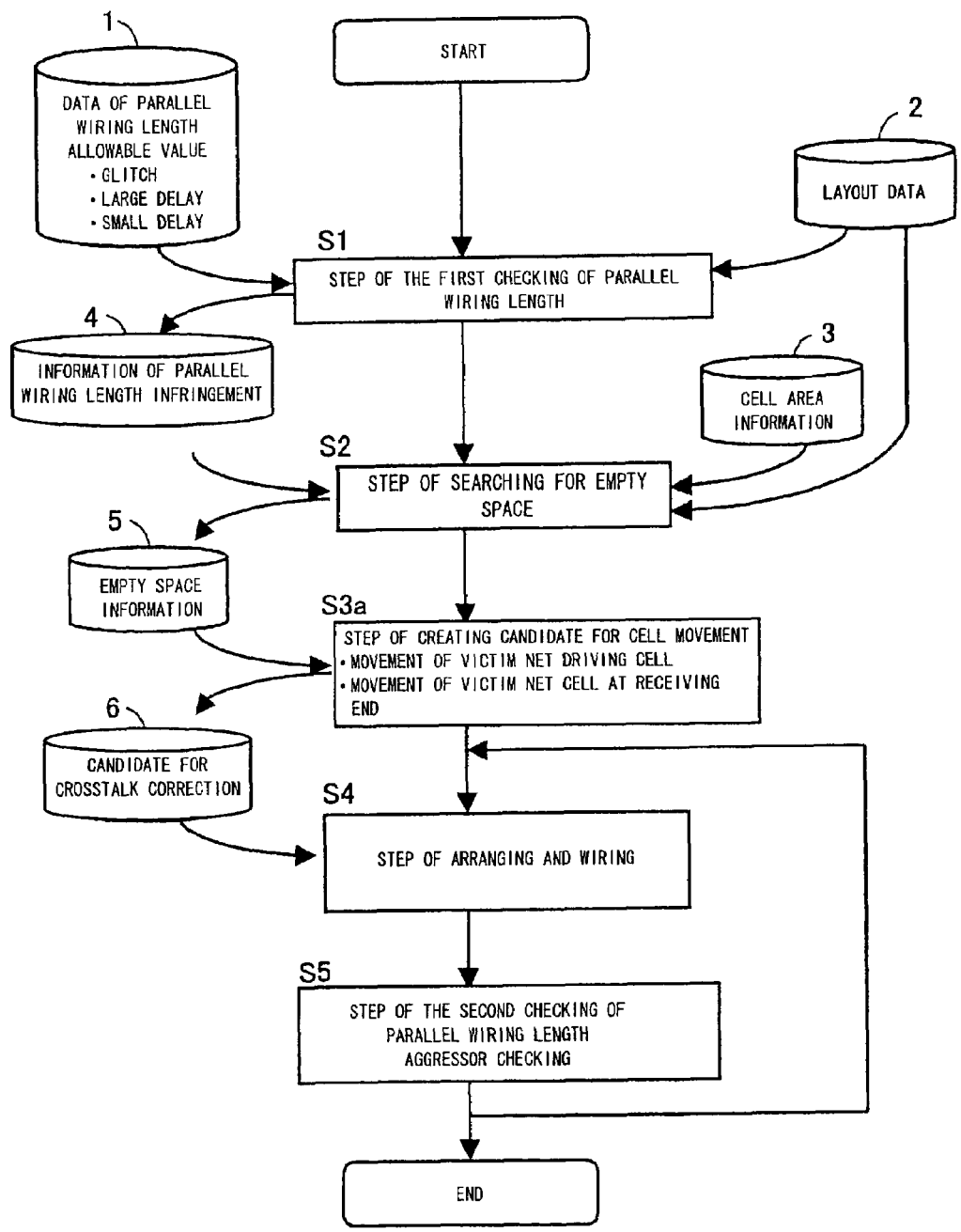
FIG. 3 is a flow diagram showing a method for correcting crosstalk (cell movement) according to a second embodiment of the present invention.
Figure 4A:
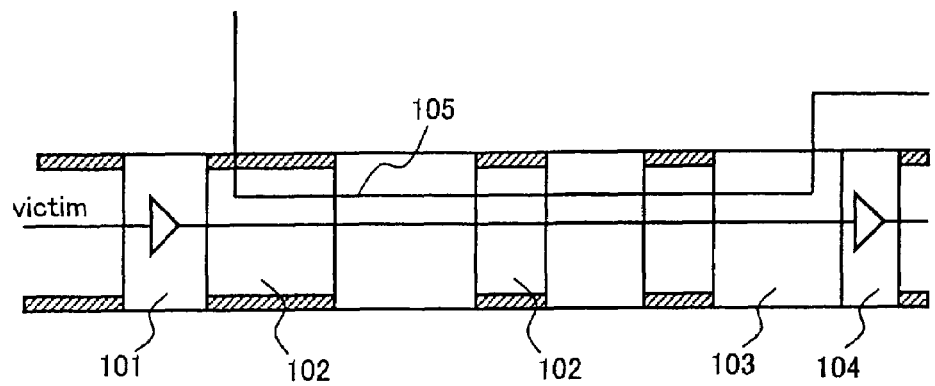
FIG. 4A is a diagram showing a specific example before performing the cell movement which is the method for correcting crosstalk according to the second embodiment of the present invention.
Figure 4B:
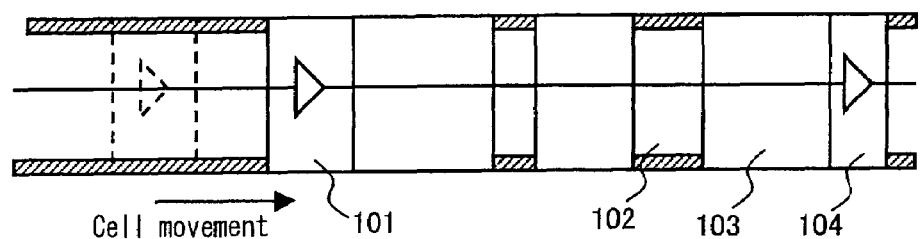
FIG. 4B is a diagram showing an example of the movement of a net driving cell.
Figure 4C:
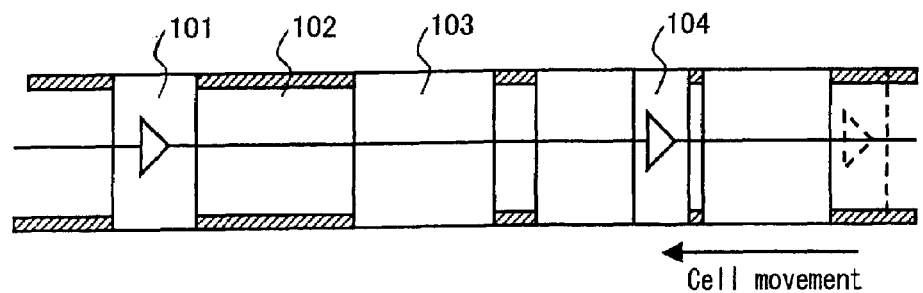
FIG. 4C is a diagram showing an example of the movement of a net driving cell at the next stage.

FIG. 3 is a flow diagram showing a method for correcting crosstalk according to a second embodiment of the present invention and FIGS. 4A, 4B and 4C are diagrams showing specific examples thereof.

In FIG. 3, S1, S2, S4 and S5 designate the same steps as those in FIG. 1 according to the first embodiment. S3a designates the step of creating a candidate for cell movement. Reference numerals 1 to 6 also designate the same components as those in FIG. 1 according to the first embodiment. In FIGS. 4A, 4B and 4C, reference numerals 101 to 105 designate the same components as those in FIGS. 2A, 2B and 2C according to the first embodiment.

With respect to the method for correcting crosstalk having the above-mentioned configuration according to the present embodiment, behaviors thereof are described below.

Referring to FIG. 3, in step S1 of the checking of a parallel wiring length, the input data 1 of a parallel wiring length allowable value is referred to and the information of parallel wiring length infringement 4 is extracted.

In step S2 of searching for an empty space, the input layout data 2 and the input cell area information 3 are referred to, and the information 5 of the empty space capable of arrangement is extracted by searching for whether or not a new element can be arranged on an infringing wiring route included in the information of parallel wiring length infringement 4.

In step S3a of creating a candidate for cell movement, when the driving cell of the infringing wiring part or the driving cell at the next stage is moved to the empty space included in the empty space information 5 to be arranged, the following processing is carried out on condition that a ratio of a cell movement distance with respect to a pre-stage wiring length and a post-stage wiring length from the moved cell should be not more than a predetermined value. In other words, the candidate for crosstalk correction 6 is extracted, in which the driving cell of the infringing wiring part or the driving cell at the next stage is moved to the empty space to be arranged and the parallel wiring part thereof is shortened to correct the crosstalk infringement. The cell movement makes the infringing parallel wiring part shorter to suppress the parallel wiring length infringement. The above-mentioned predetermined value, which is intended to suppress the variation of delay values of a pre-stage net and a post-stage net caused by the cell movement, depends on the technology, layout, and circuit, and is beforehand obtained by simulation such as SPICE.

In step S4 of arranging and wiring, the cell is moved and arranged according to the candidate for crosstalk correction 6 to connect the wiring to an input pin of the cell.

In step S5 of the second checking of the parallel wiring length, it is checked whether or not the changed part causes new parallel wiring length infringement. When the infringement occurs, the procedure returns to step S4 of arranging and wiring to repeat it.

Specific examples of the method for correcting crosstalk behaving in the above-mentioned manner according to the present embodiment are explained below.

Referring to FIG. 4A, there is arranged the adjacent wiring 105 to the victim net, and a parallel wiring length to the adjacent wiring 105 is larger than the value included in the data 1 of the parallel wiring length allowable value shown in FIG. 3 with respect to the driving capability of the driving cell 101 of the victim net, which shows an example of the parallel wiring length infringement. In this case, since there is an empty space capable of arrangement, which is found by searching for the empty space 102 in which a cell can be arranged on the wiring route, the driving cell 101 of the victim net or the driving cell 104 at the next stage is arranged. At this time, on condition that the ratio of the cell movement distance with respect to the wiring lengths of the pre-stage net and the post-stage net from the moved cell should be not more than the predetermined value, the driving cell 101 or the driving cell 104 at the next stage of the victim net is moved to be arranged.

In FIG. 4B, the driving cell 101 of the victim net is moved in the right direction to be arranged and wired.

In FIG. 4C, the driving cell 104 at the next stage of the victim net is moved in the left direction to be arranged and wired.

As described above, according to the present embodiment, the driving cell of the parallel wiring exceeding the parallel wiring length allowable value or the driving cell at the next stage is moved to the parallel wiring route, whereby delay variation and logic inversion exceeding allowable values thereof due to crosstalk are prevented from occurring.

Embodiment 3

Figure 5:
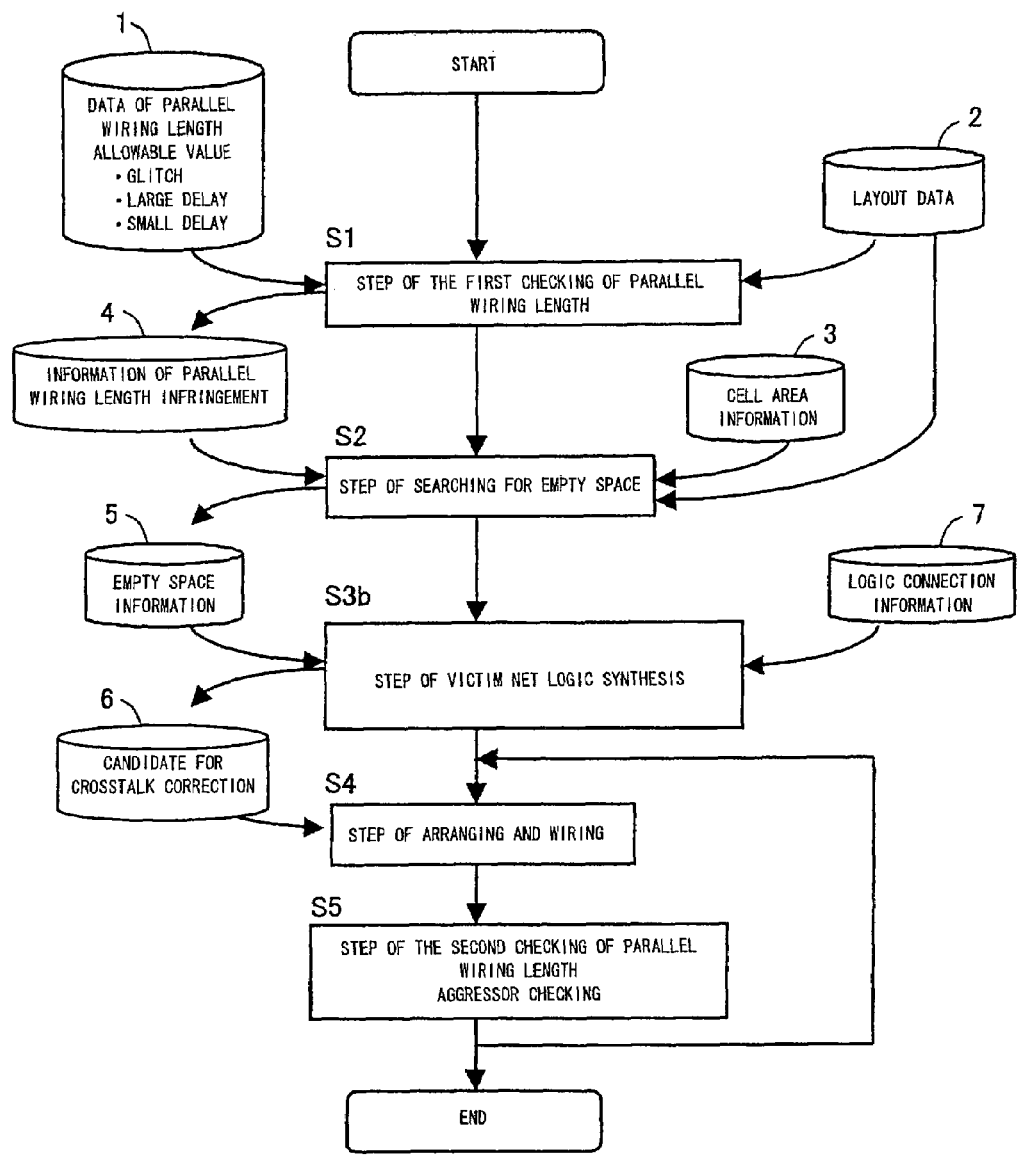
FIG. 5 is a flow diagram showing a method for correcting crosstalk (victim net logic resynthesis) according to a third embodiment of the present invention.
Figure 6A:
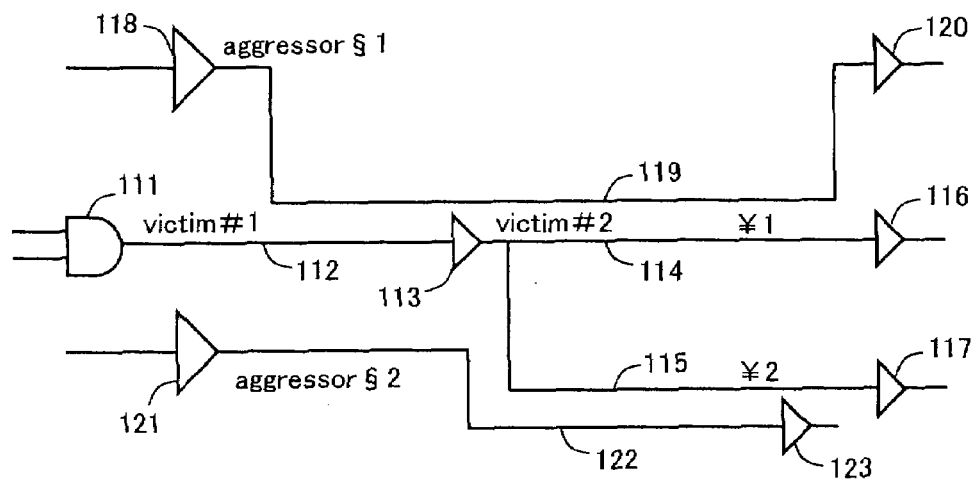
FIG. 6A is a diagram showing a specific example before performing the victim net logic resynthesis according to the third embodiment of the present invention.
Figure 6B:
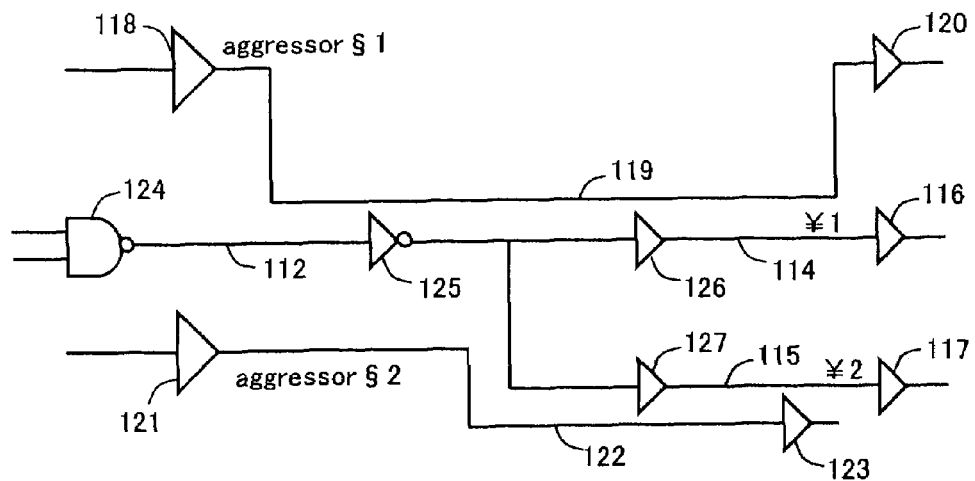
FIG. 6B is a diagram showing a specific example after performing the logic resynthesis.

FIG. 5 is a flow diagram showing a method for correcting crosstalk (victim net logic resynthesis) according to a third embodiment of the present invention and FIGS. 6A and 6B are diagrams showing specific examples thereof.

In FIG. 5, S1, S2, S4 and S5 designate the same steps as those in FIG. 1 according to the first embodiment. S3b designates the step of victim net logic synthesis. Reference numerals 1 to 6 also designate the same components as those in FIG. 1 according to the first embodiment. A reference numeral 7 designates logic connection information.

Referring to FIGS. 6A and 6B, a reference numeral 111 designates a driving cell AND gate of a victim net #1; a reference numeral 112, victim net #1 wiring; a reference numeral 113, a victim net #2 driving cell; a reference numeral 114, fan-out ¥1 wiring of the victim net #2; a reference numeral 115, fan-out ¥2 wiring of the victim net #2; a reference numeral 116, a fan-out ¥1 driving cell at the next stage; a reference numeral 117, a fan-out ¥2 driving cell at the next stage; a reference numeral 118, an aggressor net §1 driving cell; a reference numeral 119, aggressor net §1 wiring; a reference numeral 120, an aggressor net §1 driving cell at the next stage; a reference numeral 121, an aggressor net §2 driving cell; a reference numeral 122, an aggressor net §2 wiring; a reference numeral 123, an aggressor net §2 driving cell at the next stage; a reference numeral 124, an NAND gate divided from the AND gate 111; a reference numeral 125, an inverter divided from the AND gate 111; a reference numeral 126, a buffer into which the driving cell 113 is divided as a fan-out on the wiring 114; and a reference numeral 127, a buffer into which the driving cell 113 is divided as a fan-out on the wiring 115.

With respect to the method for correcting crosstalk having the above-mentioned configuration according to the present embodiment, behaviors thereof are described below.

Referring to FIG. 5, in step S1 of the first checking of a parallel wiring length, the input data 1 of a parallel wiring length allowable value is referred to and the information of parallel wiring length infringement 4 is extracted.

In step S2 of searching for an empty space, the input layout data 2 and the input cell area information 3 are referred to, and the information 5 of the empty space capable of arrangement is extracted by searching for whether or not a new element can be arranged on an infringing wiring route included in the information of parallel wiring length infringement 4.

In step S3b of victim net logic synthesis, the net part including the wiring which infringes the parallel wiring length is logically resynthesized based on the input logic connection information 7 to extract a candidate for crosstalk correction. In this case, the number of elements is increased by logic decomposition and the divided cells are arranged in empty space to shorten the parallel part on the wiring. Alternatively, fan-outs of the net are changed to reduce a slew rate (signal transition time) of the victim net. Thereby, the infringing parallel wiring part is shortened to suppress the parallel wiring length infringement.

In step S4 of arranging and wiring, a cell is arranged according to the candidate for crosstalk correction 6 to connect the wiring to an input pin of the cell.

In step S5 of the second checking of the parallel wiring length, it is checked whether or not the changed part causes new parallel wiring length infringement. When the infringement occurs, the procedure returns to step S4 of arranging and wiring to repeat it.

Specific examples of the method for correcting crosstalk behaving in the above-mentioned manner according to the present embodiment are explained below.

Referring to FIG. 6A, there are parallel wiring consisting of the victim net #1 wiring 112 and the aggressor net §1 wiring 119, parallel wiring consisting of fan-out ¥1 wiring 114 of the victim net #2 and the aggressor net §1 wiring 119 and parallel wiring consisting of the fan-out ¥2 wiring 115 of the victim net #2 and an aggressor net §2 wiring 122. Each of the parallel wiring lengths is larger than the value included in the data 1 of the parallel wiring length allowable value shown in FIG. 5, which shows parallel wiring length infringement. In this case, the empty space in which a cell can be arranged is searched for on the wiring route.

Subsequently, in step S3b of victim net logic synthesis as shown in FIG. 5, the driving cell AND gate 111 of the victim net #1 is logically decomposed to the NAND gate 124 and the inverter 125, and the driving cell 113 of the victim net #2 is divided into the buffer 126 and the buffer 127 as fan-outs to arrange the divided cells in the empty space.

As described above, according to the present embodiment, the driving cell of the parallel wiring exceeding the parallel wiring length allowable value or the driving cell at the next stage is logically decomposed by the logic resynthesis, and the number of fan-outs is changed to increase the elements on the infringing wiring in the number, thereby preventing delay variation and logic inversion exceeding the allowable values due to crosstalk from occuring.

Embodiment 4

Figure 7:
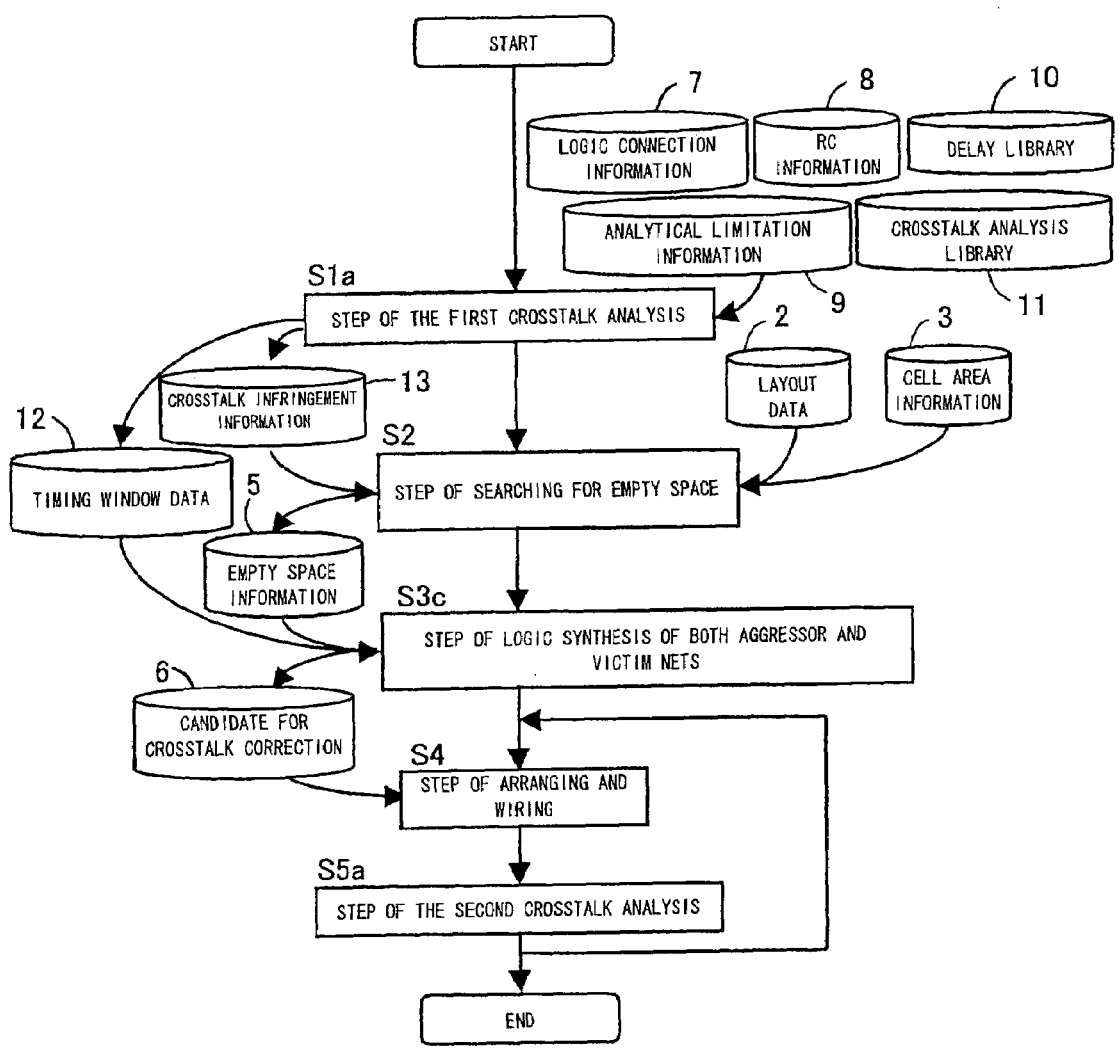
FIG. 7 is a flow diagram showing a method for correcting crosstalk (logic resynthesis of both aggressor and victim nets) according to a fourth embodiment of the present invention.
Figure 8A:
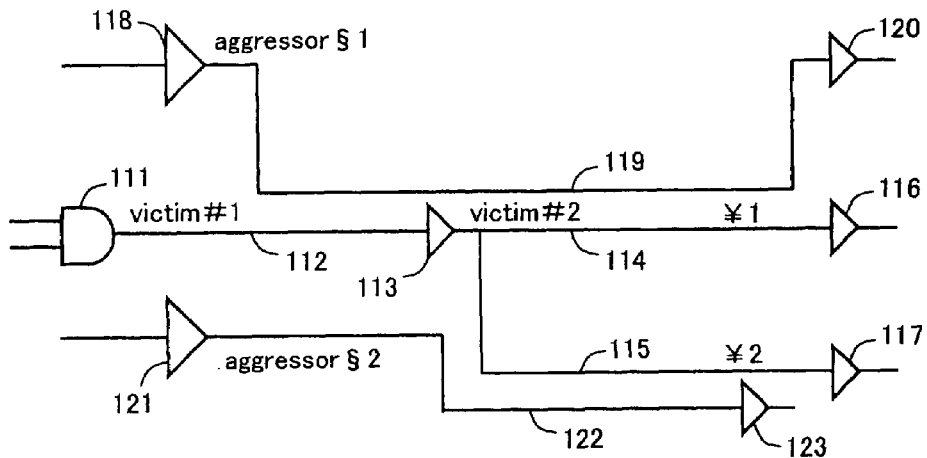
FIG. 8A is a diagram showing a specific example before performing the logic synthesis of both aggressor and victim nets according to the fourth embodiment of the present invention.
Figure 8B:
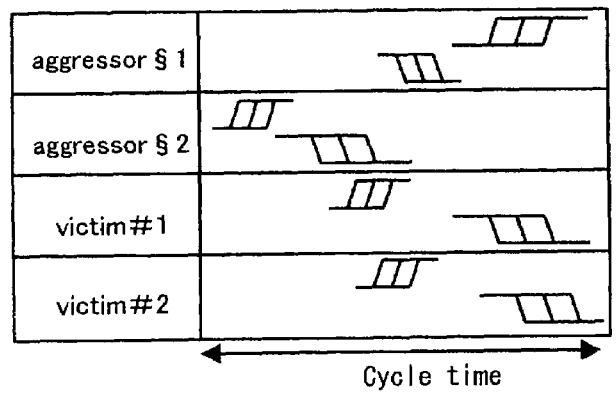
FIG. 8B is a diagram showing timing windows.
Figure 8C:
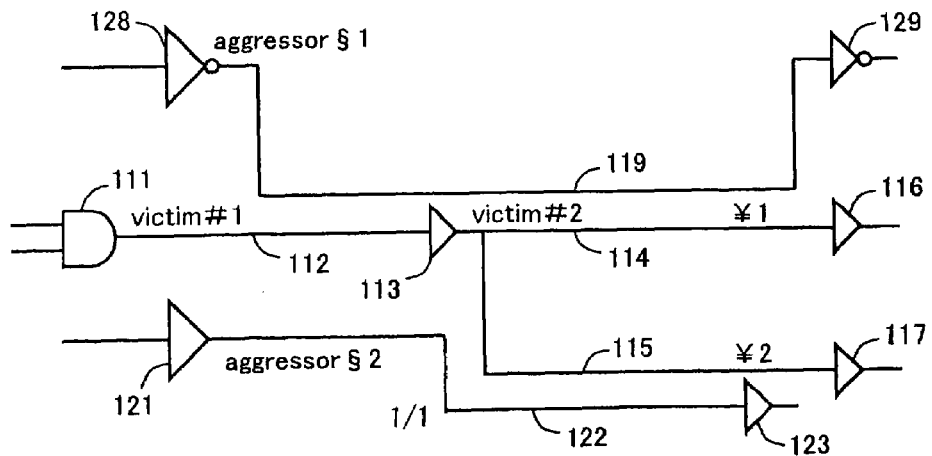
FIG. 8C is a diagram showing a specific example after performing the logic synthesis.

FIG. 7 is a flow diagram showing a method for correcting crosstalk (logic resynthesis of both aggressor and victim nets) according to a fourth embodiment of the present invention and FIGS. 8A, 8B and 8C are diagrams showing specific examples thereof.

In FIG. 7, S2 and S4 designate the same steps as those in FIG. 1 according to the first embodiment. S1a designates the step of the first crosstalk analysis; S3c, the step of logic synthesis of both aggressor and victim nets; and S5a, the step of the second crosstalk analysis. Reference numerals 2 to 7 designate the same components as those in FIG. 5 according to the third embodiment. A reference numeral 8 designates RC information; a reference numeral 9, analytical limitation information; a reference numeral 10, delay library; a reference numeral 11, crosstalk analysis library; a reference numeral 12, timing window data; and a reference numeral 13, crosstalk infringement information.

In FIGS. 8A, 8B and 8C, for the same numerals as those in FIGS. 6A and 6B according to the third embodiment, detailed description is omitted. Reference numerals 128 and 129 designate inverters applied to logic inversion.

With respect to the method for correcting crosstalk having the above-mentioned configuration according to the present embodiment, behaviors thereof are described below.

Referring to FIG. 7, in step S1a of the first crosstalk analysis, delay calculation and timing analysis are performed in view of delay variation due to crosstalk caused by synchronous transitions, while retaining a timing window, based on the logic connection information 7, the RC information 8, the analytical limitation information 9, the delay library 10, and the crosstalk analysis library 11, which have already been input. Then, the crosstalk infringement information 13 which includes wiring with crosstalk generated in a path with timing infringement generated due to crosstalk and the timing window data 12 are extracted.

In step S2 of searching for an empty space, the layout data 2 and the cell area data 3 which have been input are referred to in order to search for whether or not a new element can be arranged on the wiring route with crosstalk and consequent delay variation generated, which is included in the crosstalk infringement information 13, and then the information 5 of the empty space capable of arrangement is extracted.

In step S3c of logic synthesis of both aggressor and victim nets, the empty space information 5 and the timing window data 12 are referred to, logic of an affecting side and an affected side of the wiring nets with crosstalk generated is decomposed, synchronous in-phase transition is inverted to opposite-phase transition (or opposite-phase transition to in-phase transition), and the delay variation which accelerates (or deaccelerates) due to the generated crosstalk is changed so as to keep the safe side with respect to the timing limitation. In such a manner, the candidate for crosstalk correction 6 is extracted to render the crosstalk influence harmless.

In step S4 of arranging and wiring, a cell is arranged for wiring based on the candidate for crosstalk correction 6.

In step S5a of the second crosstalk analysis, it is checked whether or not the changed circuit causes new infringement due to crosstalk. When the infringement occurs, the procedure returns to step S4 of arranging and wiring to repeat it.

Specific examples of the method for correcting crosstalk behaving in the above-mentioned manner according to the present embodiment are explained below.

In a circuit as shown in FIG. 8A, step S1a of the first crosstalk analysis of FIG. 7 is such that by using the logic connection information 7, the RC information 8, the analytical limitation information 9, the delay library 10, and the crosstalk analysis library 11, first, delay calculation is performed with disregard to delay variation due to crosstalk to analyze the timing and then to extract the timing window data. Then, assuming that delay variation due to crosstalk is generated between nets having coupling capacitance and transiting synchronously, delay calculation is performed for the nets in view of crosstalk to analyze the timing and the timing window data is updated (refer to FIG. 8B). This update is repeated until the timing window data becomes unvaried.

Suppose that paths including the fan-out ¥1 driving cell 116 at the next stage and the fan-out ¥2 driving cell 117 at the next stage of the victim net #2 in FIG. 8A cause setup infringement. The timing window data as shown in FIG. 8B shows that the timing window of the aggressor net §1 coincides with those of the victim nets #1 and #2, generating crosstalk. In contrast, the timing window of the aggressor net §2 does not coincide with that of the victim net #2, generating no crosstalk. Accordingly, in the step of crosstalk analysis, the aggressor net §1 and the victim net #1, and the aggressor net §1 and the victim net #2 are targets for correction and included in the crosstalk infringement information.

In step S2 of searching for an empty space in FIG. 7, the empty space is searched for on the routes of the aggressor net §1 wiring 119, and the victim net #1 wiring 112 and the fan-out ¥1 wiring 114 of the victim net #2 to include the result in the empty information 5.

From the empty space information 5 and the timing window data 12, a candidate for inverting logic of the agressor net §1 is selected after consideration is given with respect to the logic decomposition, the logic inversion or the change in the number of fan-outs in step S3c of logic synthesis of both the victim and aggressor nets. As shown in a circuit of FIG. 8C, in the aggressor net §1, the buffer 118 is changed to the inverter 128 and the buffer 120 to the inverter 129. When the logic of the aggressor net is inverted, the synchronous transitions of the aggressor net §1 and the victim net #1, and the aggressor net §1 and the victim net #2 are changed from in-phase transition to opposite-phase transition. As a result, the delay variation due to crosstalk is changed from deaccelaration to acceleration, thereby improving the timing with respect to the setup infringement.

As described above, according to the present embodiment, with respect to the timing limitation infringing path due to crosstalk, the timing of signal transition is changed by logic resynthesis to invert a signal transition direction. Alternatively, a load is varied by the change in the fan-outs. Thereby, crosstalk delay variation is prevented from occurring. If ever, by varying to a more harmless direction, the infringement of the timing limitation caused by delay variation due to crosstalk can be prevented from occurring.

Embodiment 5

Figure 9:
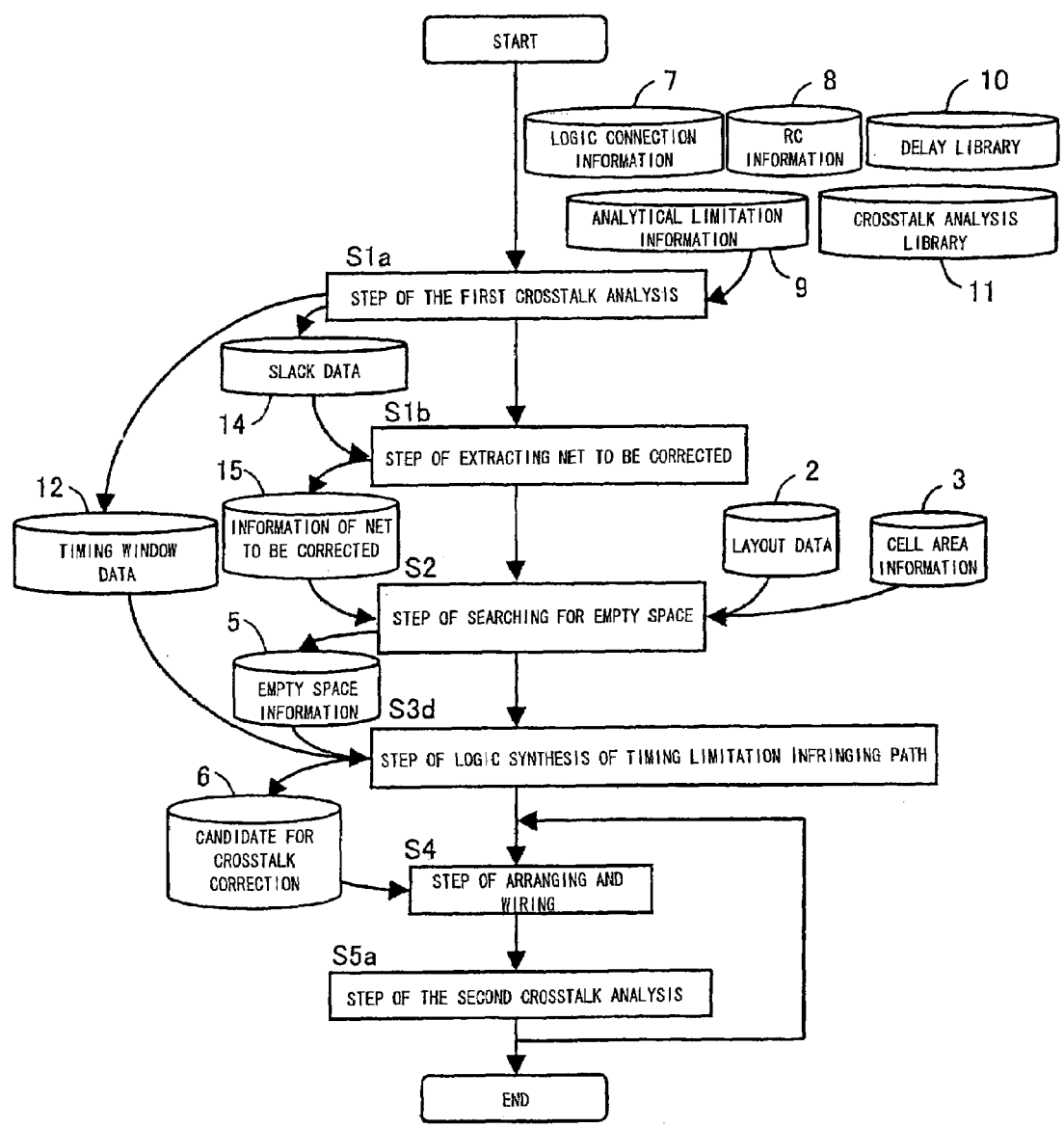
FIG. 9 is a flow diagram showing a method for correcting crosstalk (correction of timing limitation infringement by logic resynthesis) according to a fifth embodiment of the present invention.

FIG. 9 is a flow diagram showing a method for correcting crosstalk (correction of timing limitation infringement by logic resynthesis) according to a fifth embodiment of the present invention and FIGS. 10A, 10B, 10C, 10D and 10E are diagrams showing specific examples thereof.

Referring to FIG. 9, S1b designates the step of extracting a net to be corrected; S3d, the step of logic synthesis of a timing limitation infringing path. A reference numeral 14 designates slack data; and a reference numeral 15, information of a net to be corrected. Since the other components are the same as those in FIG. 7 according to the fourth embodiment, they are indicated by the same numerals and signs and a detailed description is omitted.

Referring to FIGS. 10A, 10B, 10C, 10D, and 10E, a reference numeral 130 designates a buffer which moves to change the position of fan-out; a reference numeral 131, fan-out ¥1 wiring of the victim net #1; a reference numeral 132, fan-out ¥2 wiring at the next stage of the victim net #1; a reference numeral 133, a fan-out ¥1 driving inverter at the next stage of the victim net #1; a reference numeral 134, hold infringement; a reference numeral 135, setup infringement; a reference numeral 136, a repeater buffer; and a reference numeral 137; a downsized repeater buffer. Since the other components are the same as those in FIG. 6 according to the third embodiment, they are indicated by the same numerals and signs and detailed description is omitted.

With respect to the method for correcting crosstalk having the above-mentioned configuration according to the embodiment, behaviors thereof are described below.

Referring to FIG. 9, in step S1a of the first cross talk analysis, delay calculation and timing analysis are performed in view of delay variation due to crosstalk caused by synchronous transitions, while retaining a timing window, based on the logic connection information 7, the RC information 8, the analytical limitation information 9, the delay library 10, and the crosstalk analysis library 11, which have already been input, and then the slack data 14 in which timing limitation infringing paths are included and the timing window data 12 are extracted.

In step S1b of extracting a net to be corrected, from nets on the timing limitation infringing paths, information 15 of the net to be corrected is extracted, which is a net having coupling capacitance exceeding a predetermined value between adjacent wiring. The predetermined value for coupling capacitance is a function of a ratio of coupling capacitance with the adjacent wiring with respect to a slack value and total wiring capacitance, and a value capable of being improved by delay variation has been obtained by simulation in advance with respect to the slack value.

In step S2 of searching for an empty space, the layout data 2 and the cell area information 3 which have been input are referred to in order to search for whether or not a new element can be arranged on the wiring route of the timing limitation infringing path and having coupling capacitance exceeding the predetermined value between the adjacent wiring, which is included in the information 15 of the net to be corrected, and then the information 5 of the empty space capable of arrangement is extracted.

In step S3d of logic synthesis of a timing limitation infringing path, the empty space information 5 and the timing window data 12 are referred to, and the logic synthesis in which logic of each net including the adjacent wiring parts is decomposed or the number of fan-outs thereof is changed is performed to find signal transitions between the adjacent wiring to be synchronous, and in the case of hold infringement, to inverse the transition to be in-phase while in the case of setup infringement, to be opposite-phase. In such a manner, there is extracted the candidate for crosstalk correcton 6, which generates delay variation accelerating (or deaccelerating) due to crosstalk.

In step S4 of arranging and wiring, the cell is arranged and wired based on the candidate for crosstalk correction 6.

In step S5a of the second crosstalk analysis, it is checked whether or not the changed new circuit causes infringement due to crosstalk. When the infringement occurs, the procedure returns to step S4 of arranging and wiring to repeat it.

Specific examples of the method for correcting crosstalk behaving in the above-mentioned manner according to the present embodiment are explained below.

Figure 10A:
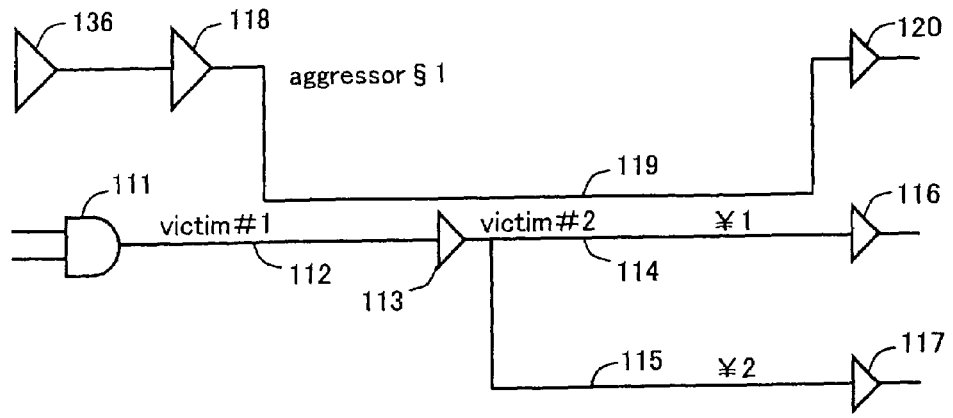
FIG. 10A is a diagram showing a specific example before performing the correction of the timing limitation infringement by logic resynthesis which is the method for correcting crosstalk according to the embodiment 5 of the present invention.
Figure 10B:
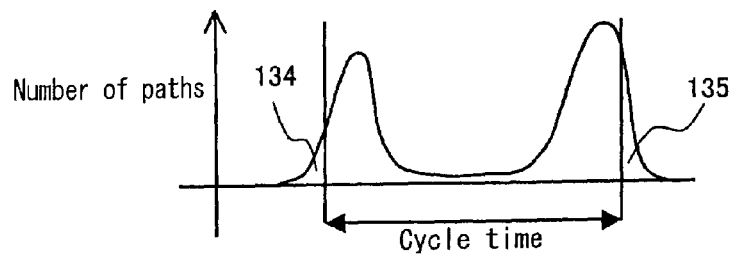
FIG. 10B is a diagram showing slack.
Figure 10C:
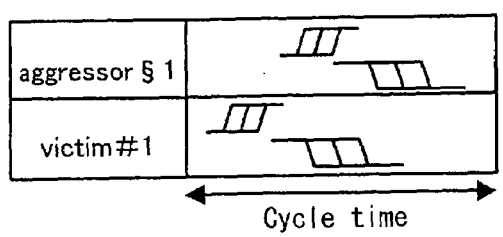
FIG. 10C is a diagram showing timing windows before performing the correction of the timing limitation infringement.

In a circuit as shown in FIG. 10A, there are parallel wiring consisting of the victim net #1 wiring 112 and the aggressor net §1 wiring 119, and parallel wiring consisting of fan-out ¥1 wiring 114 of the victim net #2 and the aggressor net §1 wiring 119. Delay calculation and timing analysis are performed in view of delay variation due to crosstalk by using the logic connection information 7, the RC information 8, the analytical limitation information 9, the delay library 10, and the crosstalk analysis library 11, which have been input in step S1a of the first crosstalk analysis in FIG. 9. Then, for all paths to be analyzed, the slack data as shown in FIG. 10B is extracted, and for the circuit part as shown in FIG. 10A, the timing window data 12 as shown in FIG. 10C is extracted.

Step S1a of the first crosstalk analysis is such that first, by performing delay calculation with disregard to delay variation due to crosstalk to analyze the timing, the timing window data is extracted. Subsequently, supposing that delay variation due to crosstalk between nets having coupling capacitance and transiting synchronously occurs, delay calculation is performed for the nets in view of crosstalk to analyze the timing and update the timing window data 12. This update is repeated until the timing window data 12 becomes unvaried.

Suppose that paths including the fan-out ¥1 driving cell 116 at the next stage and the fan-out ¥2 driving cell 117 at the next stage of the victim net #2 in FIG. 10A cause hold infringement. In other words, in the slack data shown in FIG. 10B, these paths are included in an area 134.

In step S2 of searching for an empty space in FIG. 9, the empty space is searched for on the wiring routes of paths including the aggressor net and the victim net.

In step S1b of extracting a net to be corrected as shown in FIG. 9, the victim net #1, the victim net #2, and the aggressor net §1, which have coupling capacitance, are extracted from the slack data. At this time, the timing window data 12 indicating signal transition in each net is shown in FIG. 10C. The signal transition timing of the aggressor net §1 and the victim net #1 does not coincide with each other.

In step S2 of searching for an empty space in FIG. 9, the empty space is searched for on the wiring routes of paths including the aggressor net §1, the victim net #1 and the victim net #2 to include the result in the empty space information 5.

Figure 10D:
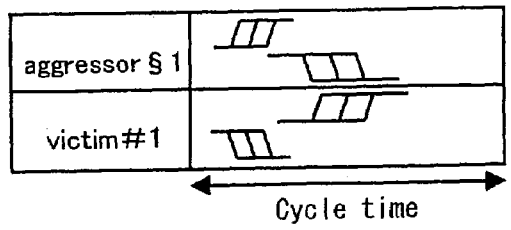
FIG. 10D is a diagram showing the timing windows after performing the correction of the timing limitation infringement.
Figure 10E:
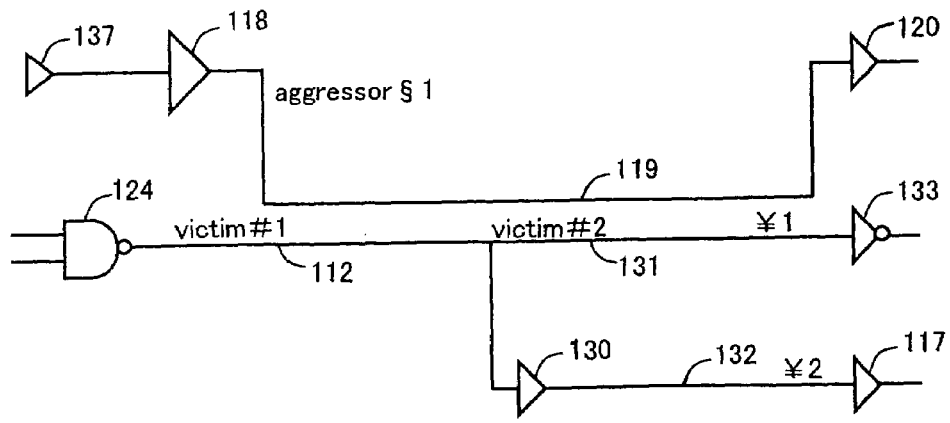
FIG. 10E is a specific example after performing the correction of the timing limitation infringement.

Based on the empty space information 5 and the timing window data 12, in the case where the aggressor net §1 has no problem with timing, whether the timing of the aggressor net §1 is changed, logic of the aggressor net or the victim net is inverted, or the number of fan-outs is changed is considered in step S3d of logic synthesis of a timing limitation infringing path in FIG. 9. Then, a repeater buffer 136 on the path including the aggressor net §1 is reduced in the cell size to make into a repeater buffer 137 and the AND gate 111 is changed to the NAND cell 124. Furthermore, the fan-out ¥1 driving cell 116 at the next stage of the victim net #2 is changed to the inverter 133 to invert logic of the victim net #1. In addition, the victim net #2 driving cell 113 is moved to a point designated by 130 and a candidate for changing the number of fan-outs of the victim net #2 is selected. The changed circuit is shown in FIG. 10E. As shown in FIG. 10D, these changes allow the signals of the aggressor net §1 and the victim net #1 to transit synchronously and in phase, thereby generating crosstalk which accelerates delay.

As described above, for the timing limitation infringing path, the signal transition timing is changed by logic synthesis to invert a signal transition direction or a load is varied by change in fan-out. This generates crosstalk delay variation in which delay is varied to an opposite direction to the timing infringement, thereby eliminating the timing infringement by the delay variation due to crosstalk.

As detailed above, according to the present invention, providing the step of buffer division, cell movement, or logic synthesis realizes an excellent method for correcting crosstalk in which the timing limitation infringement and function error due to crosstalk are corrected without increasing an area and power consumption.

From the above description, it will be apparent what the present invention provides.

What is claimed is:

1. A method for correcting crosstalk in layout designing of a semiconductor integrated circuit, comprising:
the step of crosstalk analysis, wherein logic connection information, RC information, analytical limitation information, delay library, and crosstalk analysis library are input to perform delay calculation and timing analysis in view of delay variation due to crosstalk caused by synchronous transitions from a timing window based on the input information and the like, and crosstalk infringement information which includes wiring with crosstalk generated and timing window data are extracted;
the step of searching for an empty space, wherein cell area information is input and the empty space is searched for on a wiring route adjacent to the position with the crosstalk generated which is included in the crosstalk infringement information while referring to the cell area information to extract empty space information;
the step of logic synthesis of both aggressor and victim nets, wherein a candidate for crosstalk correction is extracted, in which the empty space information and the timing window data are referred to, logic of an affecting side and an affected side of the wiring nets with crosstalk generated is decomposed, synchronous in-phase transition is inverted to opposite-phase transition or opposite-phase transition to in-phase transition, and the delay variation is changed so as to keep the safe side with respect to timing limitation;

the step of arranging and wiring, wherein the cell is arranged and wired based on the candidate for crosstalk correction; and the step of a second crosstalk analysis, wherein the crosstalk infringement is checked with respect to the new corrected circuit.

2. A method for correcting crosstalk in layout designing of a semiconductor integrated circuit, comprising:

the step of crosstalk analysis, wherein logic connection information, RC information, analytical limitation information, delay library, and crosstalk analysis library are input to perform delay calculation and timing analysis in view of delay variation due to crosstalk caused by synchronous transitions from a timing window based on the input information and the like, and slack data which includes timing limitation infringement information and timing window data are extracted;

the step of extracting a net to be corrected, wherein the net to be corrected which has coupling capacitance exceeding a predetermined value with adjacent wiring is extracted from nets on timing limitation infringing paths which are included in the slack data, the step of searching for an empty space, wherein cell area information is input and referring to the cell area information, the empty space is searched for on a wiring route having the coupling capacitance which is included in the information of the net to be corrected to extract empty space information;

the step of logic synthesis of the timing limitation infringing path, wherein a candidate for crosstalk correction is extracted, in which the empty space information and the timing window data are referred to, the logic synthesis in which logic of the nets including the adjacent wiring parts is decomposed or the number of fan-outs thereof is changed is performed to find signal transitions between the adjacent wiring to be synchronous, and in the case of hold infringement, to inverse the transition to be in-phase while in the case of setup infringement, to be opposite-phase;

the step of arranging and wiring, wherein a cell is arranged and wired based on the candidate for crosstalk correction; and the step of the second crosstalk analysis, wherein the crosstalk infringement is checked with respect to the new corrected circuit.

* * * * *